(12) United States Patent
Han et al.

(10) Patent No.: US 9,978,589 B2
(45) Date of Patent: May 22, 2018

(54) NITROGEN-POLAR SEMIPOLAR AND GALLIUM-POLAR SEMIPOLAR GAN LAYERS AND DEVICES ON SAPPHIRE SUBSTRATES

(71) Applicant: Yale University, New Haven, CT (US)

(72) Inventors: Jung Han, Woodbridge, CT (US); Benjamin Leung, Toronto (CA)

(73) Assignee: Yale University, New Haven, CT (US)

( * ) Notice: Subject to any disclaimer, the term of this patent is extended or adjusted under 35 U.S.C. 154(b) by 0 days. days.

(21) Appl. No.: 15/304,135

(22) PCT Filed: Apr. 15, 2015

(86) PCT No.: PCT/US2015/025899
§ 371 (c)(1),
(2) Date: Oct. 14, 2016

(87) PCT Pub. No.: WO2015/160903
PCT Pub. Date: Oct. 22, 2015

(65) Prior Publication Data
US 2017/0047220 A1   Feb. 16, 2017

Related U.S. Application Data

(60) Provisional application No. 61/980,283, filed on Apr. 16, 2014.

(51) Int. Cl.
*H01L 33/00*   (2010.01)
*H01L 21/02*   (2006.01)
(Continued)

(52) U.S. Cl.
CPC ........ *H01L 21/0254* (2013.01); *C30B 25/186* (2013.01); *C30B 29/20* (2013.01);
(Continued)

(58) Field of Classification Search
CPC ... H01L 33/007; H01L 33/32; H01L 21/0254; C30B 25/186; C30B 29/20
See application file for complete search history.

(56) References Cited

U.S. PATENT DOCUMENTS

| | | | |
|---|---|---|---|
| 4,948,456 A | 8/1990 | Schubert | |
| 4,952,526 A | 8/1990 | Pribat et al. | |

(Continued)

FOREIGN PATENT DOCUMENTS

| | | |
|---|---|---|
| CN | 101743618 A | 6/2010 |
| CN | 103348044 A | 10/2013 |

OTHER PUBLICATIONS

International Search Report and Written Opinion for PCT/US2014/029219 dated Jul. 7, 2015.

(Continued)

*Primary Examiner* — Matthew Reames
(74) *Attorney, Agent, or Firm* — Wolf, Greenfield & Sacks, P.C.

(57) ABSTRACT

Methods and structures for forming epitaxial layers of semipolar III-nitride materials on patterned sapphire substrates are described. Semi-nitrogen-polar GaN may be grown from inclined c-plane facets of sapphire and coalesced to form a continuous layer of (2021) GaN over the sapphire substrate. Nitridation of the sapphire and a low-temperature GaN buffer layer is used to form semi-nitrogen-polar GaN.

29 Claims, 7 Drawing Sheets

(51) Int. Cl.
*C30B 25/18* (2006.01)
*C30B 29/20* (2006.01)
*C30B 29/40* (2006.01)
*H01L 21/306* (2006.01)
*H01L 21/308* (2006.01)
*H01L 33/32* (2010.01)

(52) U.S. Cl.
CPC ........ *C30B 29/406* (2013.01); *H01L 21/0242* (2013.01); *H01L 21/0243* (2013.01); *H01L 21/0262* (2013.01); *H01L 21/02433* (2013.01); *H01L 21/02458* (2013.01); *H01L 21/02609* (2013.01); *H01L 21/02639* (2013.01); *H01L 21/02647* (2013.01); *H01L 21/3086* (2013.01); *H01L 21/30604* (2013.01); *H01L 33/007* (2013.01); *H01L 33/32* (2013.01)

(56) References Cited

U.S. PATENT DOCUMENTS

| | | | |
|---|---|---|---|
| 5,356,510 | A | 10/1994 | Pribat et al. |
| 5,587,014 | A | 12/1996 | Iyechika et al. |
| 6,617,668 | B1 | 9/2003 | Koide et al. |
| 7,390,750 | B1 | 6/2008 | Ramkumar et al. |
| 7,727,874 | B2 | 6/2010 | Hanser et al. |
| 8,252,684 | B1 | 8/2012 | Lee et al. |
| 8,482,103 | B2* | 7/2013 | Liu .................. H01L 21/02381 257/613 |
| 8,698,173 | B2* | 4/2014 | Goswami ............ H01L 21/0237 257/103 |
| 2002/0179911 | A1 | 12/2002 | Linthicum et al. |
| 2002/0189534 | A1 | 12/2002 | Tang et al. |
| 2003/0211713 | A1 | 11/2003 | Suguro et al. |
| 2004/0175844 | A1 | 9/2004 | Yang et al. |
| 2004/0261692 | A1 | 12/2004 | Dwilinksi et al. |
| 2005/0184307 | A1 | 8/2005 | Li et al. |
| 2006/0131606 | A1 | 6/2006 | Cheng |
| 2006/0292719 | A1 | 12/2006 | Lochtefeld et al. |
| 2007/0017439 | A1 | 1/2007 | Xianyu et al. |
| 2007/0080369 | A1 | 4/2007 | Sakai |
| 2008/0042543 | A1 | 2/2008 | Conrad |
| 2008/0093622 | A1 | 4/2008 | Li et al. |
| 2009/0001416 | A1 | 1/2009 | Chua et al. |
| 2009/0032799 | A1 | 2/2009 | Pan |
| 2009/0098343 | A1 | 4/2009 | Arena et al. |
| 2010/0012948 | A1 | 1/2010 | Usikov et al. |
| 2010/0102307 | A1 | 4/2010 | Chua et al. |
| 2010/0117188 | A1 | 5/2010 | Waldrab et al. |
| 2010/0171176 | A1 | 7/2010 | Wells |
| 2010/0187568 | A1 | 7/2010 | Arena |
| 2010/0210067 | A1 | 8/2010 | Butcher et al. |
| 2011/0045658 | A1 | 2/2011 | Liu et al. |
| 2011/0065264 | A1 | 3/2011 | Moffatt et al. |
| 2011/0227198 | A1 | 9/2011 | Wunderer et al. |
| 2011/0244663 | A1 | 10/2011 | Su |
| 2011/0254134 | A1 | 10/2011 | Detchprohm et al. |
| 2011/0292957 | A1 | 12/2011 | Bhat et al. |
| 2012/0025195 | A1 | 2/2012 | McComber et al. |
| 2012/0043528 | A1 | 2/2012 | Lo et al. |
| 2012/0098102 | A1 | 4/2012 | Imer et al. |
| 2012/0104558 | A1 | 5/2012 | Ishibashi |
| 2012/0112603 | A1 | 5/2012 | Masaki |
| 2012/0115293 | A1 | 5/2012 | Noh et al. |
| 2013/0001682 | A1 | 1/2013 | Tang et al. |
| 2013/0015492 | A1 | 1/2013 | Hashimoto et al. |
| 2013/0294782 | A1 | 11/2013 | Liboiron-Ladouceur et al. |
| 2013/0313567 | A1* | 11/2013 | Furuya .................. C30B 29/406 257/76 |

OTHER PUBLICATIONS

International Preliminary Report on Patentability for PCT/US2014/029219 dated Oct. 27, 2016.

Honda et al., Growth of GaN free from cracks on a (111) Si substrate by selective metalorganic vapor-phase epitaxy. Appl Phys Lett. Jan. 14, 2002;80(2):222-4.

Kawaguchi et al., Influence of polarity on carrier transport in semipolar (2021) and (2021) multiple-quantum-well light-emitting diodes. Appl Phys Lett. 2012;100:231110.1-4.

Piprek, Efficiency droop in nitride-based light-emitting diodes. Physica Status Solidi (a). Oct. 2010;207(10):2217-25.

Pribat et al., Conformal vapor phase epitaxy. Appl Phys Lett. 1989;55(24):2544-6. doi: 10.1063/1.101976.

Pribat et al., Defect-free, conformally grown (100) GaAs films. Appl Phys Lett. Jul. 1990;57(4):375-7. doi: 10.1063/1.103696.

Shubert et al., Confined Lateral Selective Epitaxial Growth of Silicon for Device Fabrication. IEEE Electron Device Letters. May 1990;11(5):181-3.

Honda et al., Growth of (11 01) GaN on a 7-degree off-oriented (0 0 1)Si substrate by selective Movpe. J of Crystal Growth. Apr. 15, 2002;82-86.

Kung et al., Polycrystalline Si thin-film transistors fabricated at ≤ 800° C.: Effects of grain size and {110} fiber texture. J. Appl. Phys. 62(4), Aug. 15, 1987; pp. 1503-1509.

\* cited by examiner g = (10̲10)

NITROGEN-POLAR SEMIPOLAR AND GALLIUM-POLAR SEMIPOLAR GAN LAYERS AND DEVICES ON SAPPHIRE SUBSTRATES

CROSS-REFERENCE TO RELATED APPLICATIONS

This application is the national phase of International Application No. PCT/US2015/025899, titled "NITROGEN-POLAR SEMIPOLAR GAN LAYERS AND DEVICES ON SAPPHIRE SUBSTRATES", filed on Apr. 15, 2015,which claims the benefit of U.S. provisional Application Ser. No. 61/980,283, titled "NITROGEN-POLAR SEMIPOLAR GAN LAYERS AND DEVICES ON SAPPHIRE SUBSTRATES," filed on Apr. 16, 2014, which applications are hereby incorporated by reference to the maximum extent allowable by law.

BACKGROUND

Technical Field

The technology relates to methods and structures for forming semi-nitrogen-polar and semi-gallium-polar III-nitride layers and devices on sapphire substrates.

Discussion of the Related Art

Gallium nitride (GaN) and other III-nitride materials are widely recognized as desirable materials for fabrication of integrated devices. These materials typically have wider band gaps than silicon-based semiconductors and can be used to make electro-optical devices (e.g., LEDs and diode lasers) that emit radiation in the green and blue regions of the visible spectrum. Also, because of their wide band-gap, III-nitride materials can exhibit higher breakdown voltages when used for fabricating integrated transistors, making these materials attractive for high-power electronics.

Like silicon, III-nitride materials may be grown as high-purity, crystalline material. Unlike silicon, III-nitride materials are typically more difficult and expensive to grow than silicon, so that bulk substrates of III-nitride materials are not currently as commercially feasible as bulk silicon substrates. As a result, researchers have developed, and continue to develop, methods for epitaxially growing integrated-circuit-grade III-nitride layers on silicon or other crystalline substrates. Once grown, integrated devices may be fabricated in the III-nitride epitaxial layers using planar microfabrication techniques.

SUMMARY

Methods and structures associated with forming semi-nitrogen-polar and semi-gallium-polar gallium nitride (GaN) layers on patterned sapphire substrates (PSS) is described. A sapphire substrate may be patterned with a surface-grating structure to expose c-plane or inclined c-plane surfaces, and GaN may be grown from these crystal-growth surfaces. A masking process may be carried out prior to GaN growth to prevent nucleation and growth at other surfaces of the patterned sapphire substrate. In some embodiments, semi-gallium-polar GaN is grown from the c-plane surfaces. In other embodiments, a nitridation process is carried out prior to growing semi-nitrogen-polar GaN from the c-plane surfaces. Growth of the GaN material may be continued, so that the material coalesces and forms a continuous GaN layer and semiconductor process surface over the patterned sapphire substrate. The techniques may be applied to various III-nitride materials.

According to some embodiments, a semipolar III-nitride substrate comprises a patterned sapphire substrate having a plurality of surfaces at different orientations and a masking layer formed over some of the surfaces. The substrate may further comprise crystal-growth surfaces that are a portion of the plurality of surfaces and that are not covered by the masking layer, and include epitaxial gallium-nitride formed adjacent the crystal-growth surfaces.

In some aspects, the patterned sapphire substrate has a (22$\underline{4}$3) facet approximately parallel to a process surface of the substrate and a c-plane facet approximately parallel to the crystal-growth surfaces. In some implementations, the patterned sapphire substrate comprises an array of trenches with the crystal-growth surfaces forming walls of the trenches. A spacing of the trenches may be between approximately 0.25 microns and approximately 10 microns, and a depth of the trenches is between approximately 50 nanometers and approximately 2 microns. In some implementations, the epitaxial gallium-nitride coalesces above the trenches to form a continuous semiconductor layer across the substrate.

According to some implementations, a semipolar III-nitride substrate may further comprise a buffer layer between the crystal-growth surfaces and the epitaxial gallium-nitride. The crystal-growth surfaces may be nitridized. In some aspects, the epitaxial gallium-nitride has a (20$\underline{2}$1) or (20$\underline{2}$1) facet parallel to an initial unetched surface of the sapphire substrate. In some implementations, the epitaxial gallium-nitride has a semi-nitrogen-polar facet parallel to a process surface of the substrate, and the crystal-growth surfaces may be nitridized.

The foregoing aspects, implementations, and features may be included in any suitable combination in an embodiment of a substrate having a semipolar gallium-nitride epitaxial layer, and may be included in any suitable combination in one or more of the following method embodiments for making a substrate having a semipolar gallium-nitride epitaxial layer.

According to some embodiments, a method for forming a semi-nitrogen-polar III-nitride substrate comprises acts of forming a conformal masking layer over a patterned surface of a patterned sapphire substrate, depositing a resist over a portion of the masking layer, etching regions of the masking layer that are not covered by the resist to expose crystal-growth surfaces on the patterned sapphire substrate, and growing semipolar gallium-nitride from the crystal-growth surfaces.

In some aspects, forming the conformal masking layer comprises depositing a material by a vapor deposition process, and the vapor deposition process may comprise plasma enhanced chemical vapor deposition or atomic layer deposition. In some implementations, the vapor deposition process comprises depositing an oxide or a nitride.

According to some implementations, depositing a resist comprises performing a shadow evaporation. The evaporant may comprise a metal. In some implementations, the evaporant comprises chromium. In some aspects, the resist does not form over surfaces of the patterned sapphire substrate that are parallel to a c-plane facet of the sapphire. In some implementations, etching regions of the masking layer comprises performing a dry etch or wet etch.

According to some aspects, growing semipolar gallium-nitride comprises epitaxially growing semi-gallium-polar GaN from the crystal-growth surfaces. In some implementations, a method for forming semipolar GaN may further comprise growing a gallium-nitride buffer layer at a temperature below approximately 600° C. prior to growing the semi-gallium-polar GaN. The semi-gallium-polar GaN may have a (20$\bar{2}$1) facet parallel to a process surface of the substrate.

In some implementations, growing semipolar gallium-nitride comprises epitaxially growing semi-nitrogen-polar GaN from the crystal-growth surfaces, and the method may further include nitridizing the crystal-growth surfaces, and growing a gallium-nitride buffer layer at a temperature below approximately 600° C. prior to growing the semi-nitrogen-polar GaN. In some aspects, nitridizing the crystal-growth surfaces comprises heating the patterned sapphire substrate to a temperature between approximately 900° C. and approximately 1000° C. in an ambient comprising a mixture of nitrogen ($N_2$) and ammonia ($NH_3$) gases. The phrases "at temperatures" and "at a temperature" may be used to refer to one or more temperatures within a range of temperatures.

According to some implementations, growing a gallium-nitride buffer layer comprises growing the gallium-nitride buffer layer to a thickness greater than approximately 50 nm. In some implementations, growing a gallium-nitride buffer layer may comprise heating the substrate to between approximately 450° C. and approximately 600° C., pressurizing a growth chamber to between approximately 100 mbar and approximately 250 mbar, flowing $NH_3$ into the growth chamber at a rate between approximately 1 slm and approximately 4 slm, flowing trimethylgallium (TMGa) into the growth chamber at a rate between approximately 30 sccm and approximately 50 sccm, and growing the gallium-nitride buffer layer to a thickness between approximately 20 nm and approximately 100 nm.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabrication, only one device and/or portion of a substrate may be shown to simplify the drawings. In practice, a large plurality of devices or structures may be fabricated in parallel across a large area of a substrate or entire substrate. The drawings are not intended to limit the scope of the present teachings in any way.

Figure 1:
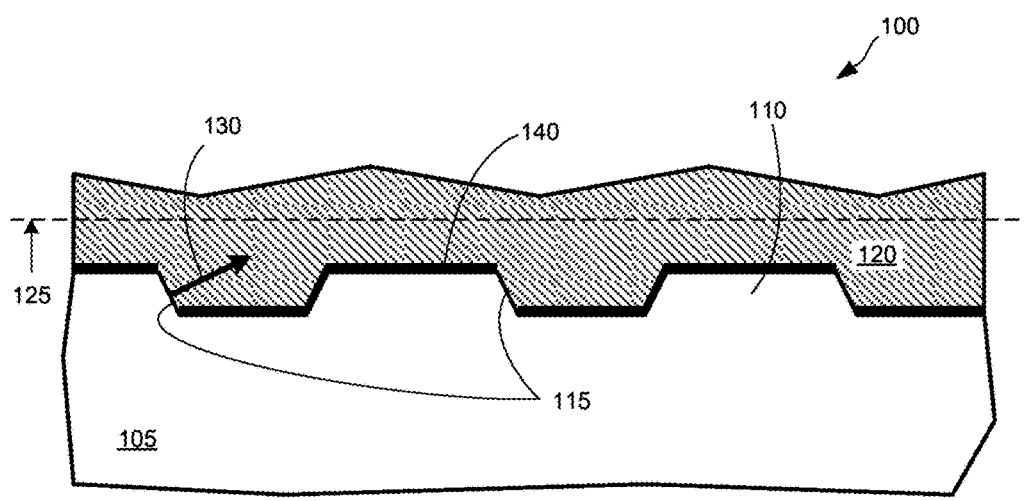
FIG. 1 is an elevation view depicting a portion of a substrate comprising III-nitride material epitaxially grown on a patterned sapphire substrate, according to some embodiments.

When referring to the drawings in the following detailed description, spatial references "top," "bottom," "upper," "lower," "vertical," "horizontal," and the like may be used. For example, "vertical" may be used to refer to a direction normal to the substrate surface, and "horizontal" may be used to refer to a direction parallel to the substrate surface when referring to the drawings. "Upper," "top," or "above" may be used to refer to a vertical direction away from the substrate, whereas "lower," "bottom," or "below" may be used to refer to a vertical direction toward the substrate. Such references are used for teaching purposes, and are not intended as absolute references for embodied devices. An embodied device may be oriented spatially in any suitable manner that may be different from the orientations shown in the drawings.

The features and advantages of the embodiments will become more apparent from the detailed description set forth below when taken in conjunction with the drawings.

DETAILED DESCRIPTION

Because of their wide band-gap values, III-nitride materials, such as GaN, are desirable materials for fabricating green-wavelength or blue-wavelength light-emitting devices and for making high-power or high-voltage transistors. The inventors have recognized and appreciated that some crystal orientations of III-nitride materials may provide improved device performance over other crystal orientations. For example, semipolar gallium nitride materials may be beneficial for high-efficiency light-emitting diodes compared to polar or non-polar orientations. In particular, semipolar gallium nitride orientations with nitrogen-polarity (referred to herein as semi-nitrogen-polar GaN) have additional benefits for light-emitting applications due to the direction of the internal polarization field and surface atomic configuration.

Although polar orientations of GaN (both gallium polar and nitrogen polar) have been formed on planarized sapphire substrates, semi-nitrogen-polar GaN has not been successfully formed on sapphire substrates. The inventors have recognized and appreciated that a patterned sapphire substrate (PSS) may provide a suitable template on which to form semi-nitrogen-polar GaN, but found that a straightforward application of processes to form nitrogen-polar GaN on the PSS failed to produce uniform, integrated-circuit-grade semi-nitrogen-polar GaN. Instead, competing nucleation resulted in heterogeneous crystallographic orientations, yielding a substrate unsuitable for integrated device fabrication.

The inventors have conceived and developed structures and processes for forming single-crystalline, semi-nitrogen-polar III-nitride materials (such as GaN) on patterned sapphire substrates. An example of a substrate suitable for use in integrated circuit fabrication is depicted in FIG. 1. A substrate 100 may comprise a patterned sapphire substrate 105 having an array of surface structures 110 patterned across a surface of the sapphire substrate. The surface structures 110 and sapphire substrate 105 may include a plurality of approximately planar surfaces, at least some of which are covered by masking material 140 that prevents crystal growth from the sapphire. Some of the surfaces may be slightly curved, in some embodiments. The surfaces may be oriented in different directions. Some of the surfaces may not be covered by the masking material, and comprise crystal-growth surfaces 115. The crystal-growth surfaces may be approximately parallel (e.g., within 10 mrad) to a c-plane facet 130 of the sapphire according to some embodiments, having an orientation depicted by the arrow. III-nitride semiconductor 120 may be grown from the crystal-growth surfaces 115 at distinct locations, and the growth may continue until the semiconductor 120 coalesces above the patterned features on the sapphire substrate, as depicted in the drawing. In some embodiments, there may be at least one thin buffer layer (not shown) formed between the crystal-growth surfaces 115 and the semiconductor 120. The III-nitride semiconductor may extend partially or entirely across the sapphire substrate and form a "process surface" of the substrate on which integrated devices may be fabricated.

Figure 2A:
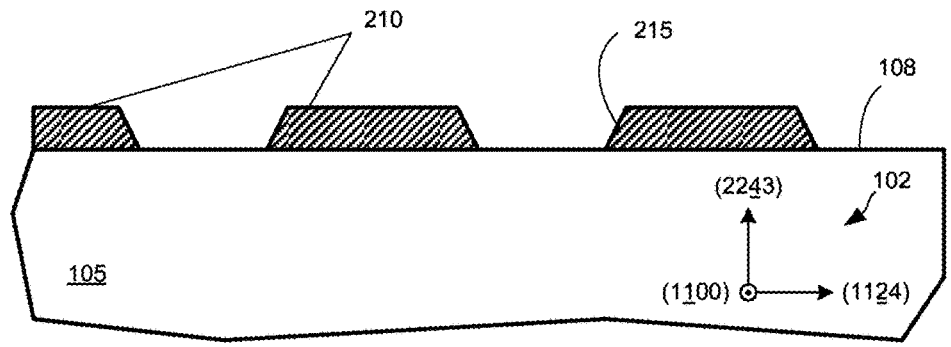
FIGS. 2A-2B depict structures associated with a process for patterning a sapphire substrate, according to some embodiments.
Figure 2B:
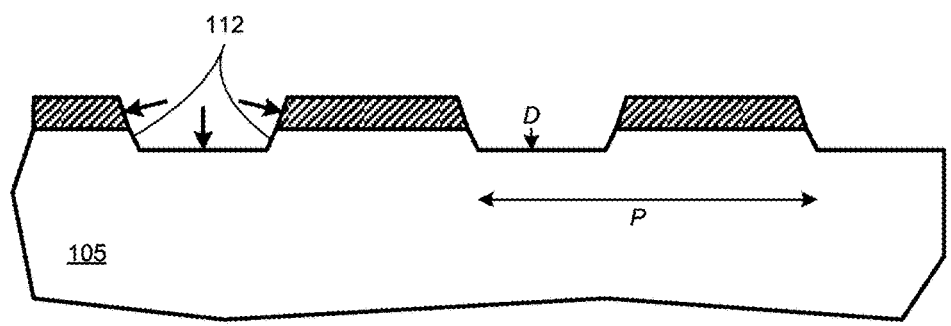

FIGS. 2A-2B depict structures associated with a method for forming a patterned sapphire substrate, according to some embodiments. An initially unetched sapphire substrate 105 may be cut so that its (22$\bar{4}$3) plane is approximately parallel to a top surface 108 of the substrate. A resist 210 may be deposited and patterned on the surface of the sapphire substrate 105. The resist may be patterned as a periodic grating, according to some embodiments, so that bars of resist 210 extend along the surface of the substrate. The resist pattern may be aligned to a crystallographic orientation of the sapphire substrate, so that the bars of resist 210 run in a direction that is approximately normal (e.g., within 10 mrad) to the (1$\bar{1}$00) plane of the sapphire substrate 105. The resist 210 may be a soft resist (e.g., a polymeric resist) according to some embodiments, or may be a hard resist (e.g., patterned inorganic material) in some implementations. In some cases, the resist may be patterned to have sloping side walls 215, as depicted in the drawing.

A dry etching process (e.g., a reactive ion etching (RIE) process) may be used to etch the sapphire substrate 105, as depicted in FIG. 2B. The etching process may be anisotropic or semi-anisotropic. According to some embodiments, the etching process may be semi-selective, in that it etches some of the resist 210, while primarily etching the substrate 105. In a semi-selective etch, as the etching of the sapphire substrate 105 proceeds, the resist 210 may etch back in addition to trenches being etched into the substrate. In some embodiments, a chlorine-based etchant may be used for etching the sapphire. In some implementations, a small amount of an etchant for the resist (e.g., $O_2$ for a polymeric resist) may be included as an etchant gas to etch back some of the resist 210. Other etchants may be used depending on the material used for the resist. In some implementations, an etchant for the sapphire substrate may partially etch a resist 210.

The result of partially etching back the resist while the trenches are being etched may create sloped sidewalls 112 along the trenches in the sapphire substrate 105, as illustrated in FIG. 2B. Instead of the sidewalls being orientated 90° with respect to the unetched surface of the sapphire substrate 105, the sidewalls may be oriented between approximately 60° and approximately 80°. In some cases, the sidewalls may be oriented between 60° and 80°. In some embodiments, the sidewalls may be oriented between approximately 65° and approximately 75°. In some cases, the sidewalls may be oriented between 65° and 75°. The slope of the etched sapphire sidewalls 112 may be controlled by adjusting the etch rate of the resist 210 (e.g., adjusting a concentration of etchant for the resist) and/or adjusting the slope of the sidewalls 215 of the resist 210 (e.g., adjusting exposure and development conditions for patterning the resist).

According to some embodiments, a spacing or pitch P of the trenches etched into the sapphire may be between approximately 0.25 micrometers (μm) and approximately 10 μm. In some cases, the pitch P may be between 0.25 μm and 10 μm. In some embodiments, the spacing between trenches may not be periodic. According to some embodiments, an etch depth D of the trenches may be between approximately 50 nanometers (nm) and approximately 2 μm. In some cases, the etch depth D may be between 50 nm and 2 μm. The width of the trenches may be approximately equal to, or equal to, one-half the pitch P, in some embodiments. In other embodiments, the width of the trenches may be greater than, or less than, one-half the pitch P. After etching the trenches, any remaining resist may be removed from the substrate 105 using a dry etch, a solvent, or a substrate cleaning process that dissolves the resist 210.

After removing the resist, a masking layer 140 may be formed over some of the patterned surfaces on the sapphire substrate. The inventors have found that a masking layer 140 comprising an evaporated oxide (e.g., silicon oxide deposited by an electron-beam evaporation process) is insufficient at masking surfaces of the patterned sapphire substrate 105 from which III-nitride growth is not desired. Irreproducible crystal-growth results encountered under subsequent high-temperature (HT) III-nitride growth conditions were believed to be attributed to less-than unity sticking coefficient, surface diffusion, and re-evaporation of the e-beam evaporated silicon oxide. To overcome problems associated with the evaporated oxide masking layer, the inventors have developed a process for forming a high-temperature conformal coating to mask selected surfaces of the sapphire substrate.

Figure 2C:
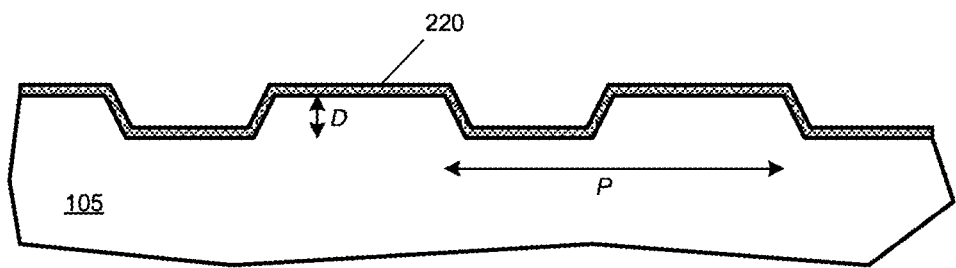
FIGS. 2C-2F depict structures associated with a process for masking selected surfaces of a patterned sapphire substrate, according to some embodiments.

According to some embodiments, a high-temperature conformal coating 220 may be formed over the surface of the patterned sapphire substrate 105, as depicted in FIG. 2C. The HT conformal coating may comprise an oxide (e.g., a silicon oxide) or a nitride (e.g., a silicon nitride) that may be formed by an HT conformal deposition process, according to some embodiments. For example, an oxide may be deposited by a (CVD) process, such as plasma-enhanced chemical vapor deposition (PECVD). In some implementations, an oxide or nitride coating 220 may be deposited by an atomic layer deposition (ALD) process. The thickness of the conformal coating may be between approximately 10 nm and approximately 50 nm according to some embodiments, and may cover all patterned surfaces of the substrate 105, as depicted in the drawing. In some cases, the thickness of the conformal coating may be between 10 nm and 50 nm.

Figure 2D:
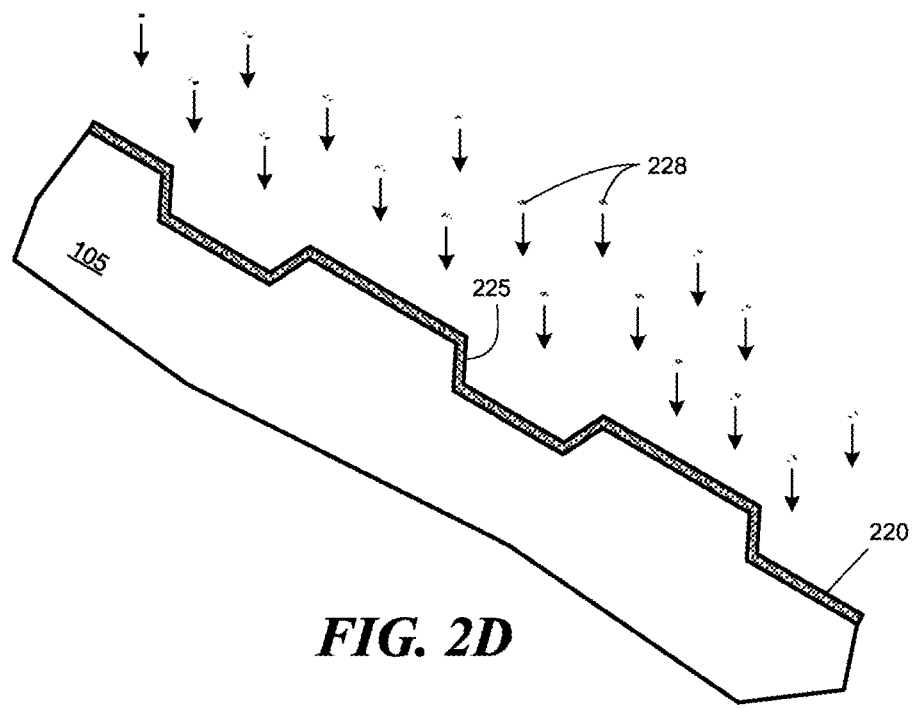
Figure 2E:
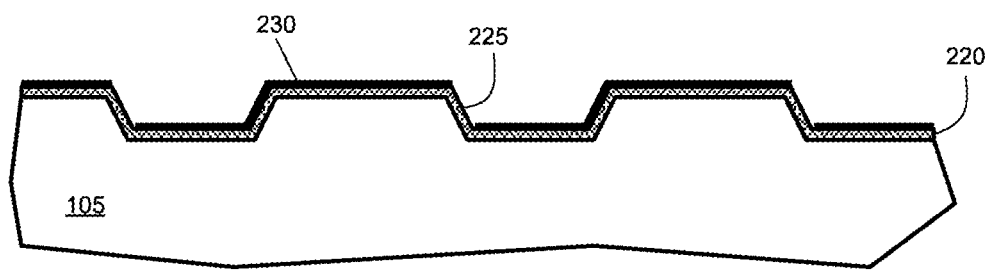

According to some embodiments, a shadow evaporation may be performed to form a resist 230 over a portion of the oxide coating 220, as depicted in FIGS. 2D-2E. For example, the substrate 105 may be inclined at an angle with respect to a target in an electron-beam evaporation system. During the evaporation, evaporants 228 may be incident on exposed surfaces of the oxide coating 220. Some "shadowed surfaces" 225 of the coating may be hidden or screened from the incident evaporants 228 by an overlying surface. These shadowed surfaces 225 may not be coated by the evaporants 228. In some embodiments the evaporants comprise metal (e.g., any one or combination of Cr, Ni, Al, Ti, Au, Ag), though other materials may be used in some embodiments.

In some embodiments, photolithography may be used to form a resist over selected surfaces of the conformal coating 220. However, photolithography would require several process steps (e.g., resist deposition, exposure, and developing), and require an alignment of a photomask to the substrate features.

Figure 2F:
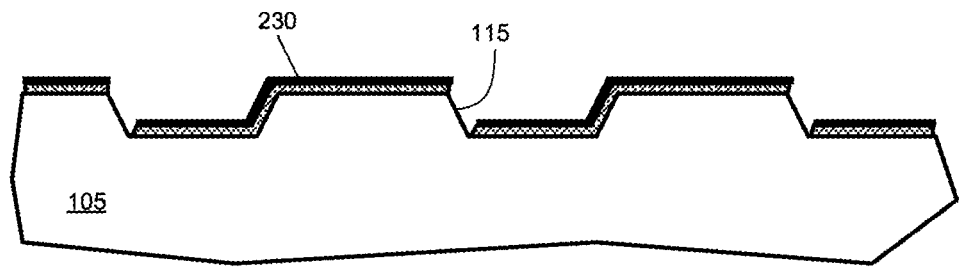

A shadow evaporation may be used to form a hard resist 230 over selected surfaces of the oxide 220 in one step without the need for alignment of a mask to the substrate, resulting in a structure as depicted in FIG. 2E. The shadowed surfaces 225, screened from the evaporant, may have an exposed oxide layer 220 covering the c-plane surfaces of the patterned sapphire substrate, but not include an overlayer of metal or other protective resist 230. A selective anisotropic dry etch may then be performed to remove the oxide coating 220 from the shadowed surfaces 225 and expose the underlying sapphire. The dry etch may comprise a fluorine-based etchant for etching an oxide coating 220, according to some embodiments. The etching may expose the underlying crystal-growth surfaces 115 of the patterned sapphire substrate, as depicted in FIG. 2F. In some embodiments, a wet etch (e.g., a buffered oxide etch) may be used to remove an oxide coating 220 from the shadowed surfaces 225. In some implementations, a wet or dry etch may not be selective, and may be a timed etch. An etch that removes the coating 220 may, in some cases, partially etch the sapphire after removing the coating.

According to some embodiments, the resist 230 may be removed with a dry or wet etch process or a substrate-cleaning process. For example, a hard coating of metal (e.g., Cr) may be removed with a suitable metal etchant. In some implementations, the substrate may be cleaned in preparation for epitaxial growth of III-nitride material. For example, the substrate may be cleaned in acetone, methanol, and a piranha solution before loading into a metal-organic chemical vapor deposition reactor for subsequent crystal growth.

The inventors have discovered and appreciated that careful preparation of a buffer layer at the exposed crystal-growth surfaces 115 of the patterned sapphire substrate 105 is needed to form semi-nitrogen-polar GaN of integrated-circuit-grade quality. Several buffer layer processes including low-temperature (LT) aluminum nitride (AlN), high-temperature AN, and low-temperature GaN buffer layer processes were tested and refined to obtain a buffer layer process that provides improved growth of semi-nitrogen-polar GaN from the patterned sapphire substrate. According to a first buffer-layer process, semi-gallium-polar GaN may be grown reliably from a patterned sapphire substrate 105. According to a second buffer-layer process, semi-nitrogen-polar GaN may be grown reliably from a patterned sapphire substrate 105.

In a first buffer-layer process, a PSS 105 may be subjected to a cleaning process followed by a LT GaN buffer layer growth process, which may be carried out in the same growth reactor. A low-temperature buffer layer may be formed at a temperature below approximately 600° C., according to some embodiments. In some cases, the low-temperature buffer layer may be formed at a temperature below 600° C. The cleaning process may comprise heating the substrate to between approximately 1000° C. and approximately 1200° C. in a hydrogen ($H_2$) ambient. In some cases, the cleaning process may be executed at a temperature between 1000° C. and 1200° C. in a hydrogen ($H_2$) ambient. The buffer layer may then be formed under GaN epitaxial growth conditions at temperatures between approximately 450° C. and approximately 600° C. In some cases, the buffer layer may be formed under GaN epitaxial growth conditions at temperatures between 450° C. and 600° C. According to some embodiments, the LT GaN buffer layer is formed at a temperature of approximately 500° C. In some instances, the LT GaN buffer layer is formed at a temperature of 500° C. In some cases, the chamber pressure may be maintained between approximately 100 mbar and approximately 250 mbar. In some instances, the chamber pressure may be maintained between 100 mbar and 250 mbar. A flow rate of $NH_3$ may be between approximately 1 slm and approximately 4 slm, and a flow rate of trimethylgallium (TMGa) may be between approximately 30 sccm and approximately 50 sccm. In some cases, a flow rate of $NH_3$ may be between 1 slm and 4 slm, and a flow rate of trimethylgallium (TMGa) may be between 30 sccm and 50 sccm. The buffer layer may be grown to a thickness between approximately 10 nm and approximately 40 nm, according to some embodiments. In some cases, the buffer layer may be grown to a thickness between 10 nm and 40 nm.

The inventors have found that a LT GaN buffer layer heated to above 900° C. may diffuse more readily than a LT AN layer. In some embodiments, a LT GaN buffer layer may migrate and redistribute from other oxide-covered surfaces of the PSS 105 to the exposed c-plane crystal-growth surfaces 115. This redistribution can promote selective growth of GaN at the crystal-growth surfaces. In some implementations, a LT AN buffer layer may be used prior to forming semi-gallium-polar GaN.

After growth of an LT GaN buffer layer according to the first buffer layer process, the temperature of the substrate may be ramped up for HT growth of semi-gallium-polar GaN from the crystal-growth surfaces. According to some embodiments, the LT GaN buffer layer may be annealed for a period of time at a temperature between approximately 900° C. and approximately 1100° C. prior to introducing reactants for GaN growth. The annealing period may be between approximately 1 minute and approximately 10 minutes. In some cases, the annealing period may be between 1 minute and 10 minutes at a temperature between 900° C. and 1100° C. HT growth of semipolar GaN may occur at temperatures between approximately 900° C. and approximately 1100° C. In some cases, HT growth may occur at temperatures between 900° C. and 1100° C.

According to other embodiments, a second buffer layer process may be used to form semi-nitrogen-polar GaN from the crystal growth surfaces. In a second buffer layer process, the PSS 105 may be thermally cleaned as described for the first buffer layer process. A nitridation process may then be performed to nitridate exposed crystal-growth surfaces 115. According to some embodiments, the nitridation process may comprise heating the PSS 105 to a temperature between approximately 900° C. and approximately 1000° C. in an ambient comprising a mixture of nitrogen ($N_2$) and ammonia ($NH_3$) gases. In some cases, the PSS may be heated to a temperature between 900° C. and 1000° C. during nitridation. The $N_2$ flow rate may be between approximately 3 and approximately 7 slm. The $NH_3$ flow rate may be between approximately 1 and approximately 5 slm. The duration of nitridation may be between approximately 0.5 and approximately 5 minutes. In some cases, the $N_2$ flow rate may be between 3 and 7 slm, the $NH_3$ flow rate may be between 1 and 5 slm, and the duration of nitridation may be between 0.5 and 5 minutes. Because of the nitridation, growth from the c-plane sapphire at the crystal-growth surfaces 115 would be least favorable compared to other surfaces of the patterned sapphire substrate 105. Therefore, the masking layer 140 (e.g., conformal oxide coating 220) is needed to prevent unwanted crystal growth at the other sapphire surfaces.

Following nitridation, the PSS may be subjected to an LT GaN buffer layer process during which the substrate is heated to between approximately 450° C. and approximately 600° C. in some implementations. In some instances, the LT GaN buffer layer deposition is carried out at a temperature between 450° C. and approximately 600° C., or at a temperature of 500° C. In some cases, the substrate may be heated to approximately 500° C., and the chamber pressure may be maintained between approximately 100 mbar and approximately 250 mbar. In some instances, the chamber pressure may be maintained between 100 mbar and 250 mbar. A flow rate of $NH_3$ may be between approximately 1 slm and approximately 4 slm. The flow rate of trimethylgallium (TMGa) may be between approximately 30 sccm and approximately 50 sccm. In some cases, the flow rate of $NH_3$ may be between 1 slm and 4 slm, and the flow rate of trimethylgallium (TMGa) may be between 30 sccm and 50 sccm. The LT GaN buffer layer may be grown to a thickness between approximately 20 nm and approximately 100 nm. In some cases, the LT GaN buffer layer may be grown to a thickness between 20 nm and 100 nm. In some embodiments, the buffer layer may be grown to a thickness greater than 50 nm. Improved growth conditions for semi-nitrogen-polar GaN are found when the LT GaN buffer layer is formed under the following conditions: the chamber pressure is approximately 200 mbar, the $NH_3$ flow rate is approximately 1 slm, the TMGa flow rate is approximately 40 sccm, and the buffer layer is grown to a thickness of approximately 80 nm.

After growth of a LT GaN buffer layer according to the second buffer layer process, the temperature of the substrate may be ramped up for HT growth of semi-nitrogen-polar GaN from the crystal-growth surfaces. In some implementations, the LT GaN buffer layer may be annealed prior to HT growth of semi-nitrogen-polar GaN material. The inventors have found improved results for subsequent growth of the semi-nitrogen-polar GaN when the anneal time for the LT GaN buffer layer is reduced compared to that used for growing semi-gallium-polar GaN by up to a factor of three. During the anneal, the $H_2$ flow rate may be between approximately 3 slm and approximately 7 slm. The $NH_3$ flow rate may be between approximately 1 slm and approximately 5 slm. In some cases, the $H_2$ flow rate may be between 3 slm and 7 slm, and the $NH_3$ flow rate may be between 1 slm and 5 slm. The duration of annealing may be between approximately 0.5 minute and approximately 3 minutes. The anneal temperature may be between approximately 900° C. and approximately 1100° C. In some cases, the duration of annealing may be between 0.5 minute and 3 minutes, and the anneal temperature may be between 900° C. and 1100° C.

A difficulty of growing semi-nitrogen-polar GaN from a LT-GaN buffer, as compared to growing semi-gallium-polar GaN, is attributed to different transformations that occur during annealing of the buffer layers based on the polarities of the buffers, and the selectivity processes that occur on patterned sapphire substrates. For example, a Ga-polar GaN LT-GaN buffer layer may undergo a ripening recrystallization phase during annealing (which can be indicated by a nose-like peak in in-situ reflectance traces). During the recrystallization phase, decomposition and redeposition of the GaN may occur, which can favor the growth of Wurtzite phase nuclei on the substrate.

In contrast, and as can be seen by reflectance measurements, an N-polar GaN buffer layer may not undergo such a transformation, so that HT-GaN growth may proceed without a roughening-recovery phase with instant oscillations. For N-polar GaN, inspection of a buffer layer and initial growth stages by scanning-electron microscopy (SEM) and atomic-force microscopy (AFM) show an enhanced decomposition of the buffer layer. A rate-limiting process of GaN decomposition may be attributed to the formation of GaH at the substrate surface. The difference in decomposition rate between gallium and nitrogen polarities may be attributed to the bond configurations in the crystal structure, where in each bilayer the metal ion has only one back bond to nitrogen atoms (case of nitrogen-polarity) instead of three bonds (gallium-polarity). For a Ga-polar GaN buffer layer, an enabling factor for uniform crystal growth is redistribution of the LT-GaN buffer layer onto the c-sapphire crystal-growth surfaces during annealing. Since redistribution does not occur readily with a nitridized sapphire surface and N-polar LT-GaN buffer layer, sparse nucleation can result, and has been observed by the inventors. To improve subsequent crystal-growth uniformity for the N-polar case, the buffer layer thickness may be increased and the buffer layer anneal time may be reduced.

According to some embodiments, a buffer layer may be formed from a material different than a subsequently-grown material. For example, a buffer layer may be formed from any suitable III-nitride alloy (e.g., AN, InN, AlGaN, InGaN, InAlGaN), whereas a subsequently-grown epitaxial layer may comprise GaN. In some implementations, a buffer layer may be formed from GaN, and a subsequently-grown semipolar epitaxial layer may comprise any other suitable III-nitride alloy. The formation of other semipolar materials may require the addition or substitution of other reactants, such as trimethylaluminum (TMA) or triethylaluminum (TEA) as sources of aluminum and trimethylindium (TMI) or triethylindium (TEI) as sources of indium. Reactants used for forming GaN epilayers may include triethylgallium (TEG) or trimethylgallium (TMGa). The flow rates for these gases may be between approximately 10 sccm and approximately 60 sccm during growth or regrowth of a semipolar III-nitride epilayer. In some cases, the flow rates for these gases may be between 10 sccm and 60 sccm during growth or regrowth of a semipolar III-nitride epilayer.

Figure 2G:
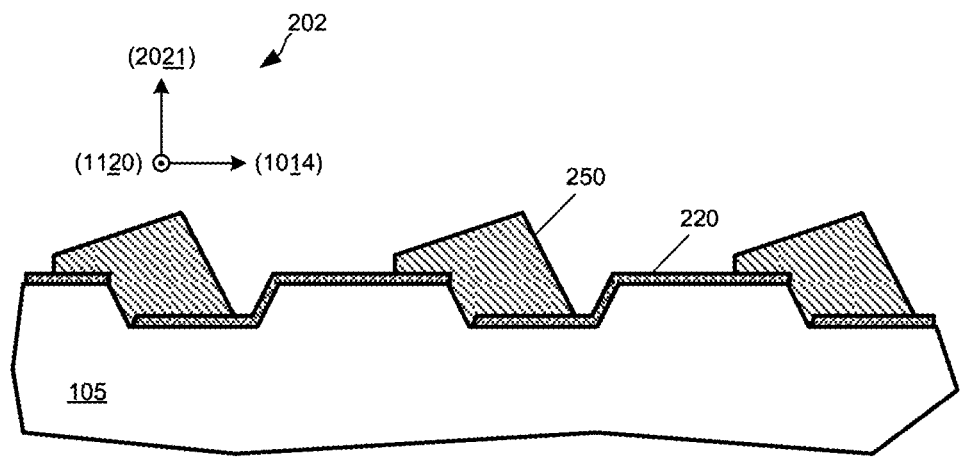
FIG. 2G depicts formation of semi-polar GaN on a patterned sapphire substrate, according to some embodiments.

After forming a buffer layer, epitaxial growth of semipolar III-nitride material may be carried out. As growth of semipolar GaN material proceeds from the crystal growth surfaces 115, islands of III-nitride crystals 250 may first form across the surface of the patterned sapphire substrate 105, as depicted in FIG. 2G. The epitaxial growth process may comprise metal-organic chemical-vapor deposition (MOCVD), according to some embodiments. In some embodiments molecular-beam epitaxy (MBE) or vapor phase epitaxy (VPE) processes may be used. Because of the inclined crystal growth surfaces 115 on the patterned sapphire substrate 105, the gallium-nitride crystals 250 may grow with a crystallographic plane (20$\underline{2}$1 for semi-gallium-polar GaN or 20$\underline{2}$1 for semi-nitrogen-polar GaN) in a direction that is parallel to the original planar surface of the sapphire substrate 105. Crystallographic orientations for semi-nitrogen-polar GaN crystals 250 are depicted by the axes 202 in FIG. 2G.

Epitaxial growth may be continued so that the III-nitride crystals 250 coalesce to form a continuous semiconductor layer 120, as depicted in FIG. 1. A thickness of the epitaxial layer may be between approximately one micron and approximately 10 microns, according to some embodiments. In some cases, a thickness of the epitaxial layer may be between one micron and 10 microns. In some implementations, an upper process surface of the semiconductor 120 may have ridges running parallel to the crystal growth surfaces 115, which result from intersections of preferred crystallographic growth planes (e.g., the (10$\underline{1}$0) and (10$\underline{1}$1) planes for semi-nitrogen-polar GaN). In some cases, a chemical-mechanical polishing (CMP) step may be used to planarize the upper surface of the semiconductor 120 layer. In some implementations, III-nitride material may be regrown from a polished and planarized semiconductor 120 layer.

In some embodiments, eptixial growth may be continued to reduce a number of defects at a process surface of the coalesced semiconductor 120. According to some embodiments, a base epitaxial layer 120 of semipolar GaN may be grown to a thickness for which a density of defects reduces to levels at the process surface that are acceptable for integrated-circuit devices. For example, a density of defects at a top surface of the epitaxial layer 120 may be less than about $10^9$ defects cm$^{-2}$ in some embodiments, less than about $10^6$ defects cm$^{-2}$ in some embodiments, less than about $10^4$ defects cm$^{-2}$ in some embodiments, less than about $10^2$ defects cm$^{-2}$ in some embodiments, and yet less than about 10 defects cm$^{-2}$ in some embodiments. In some cases, a density of defects at a top surface of the epitaxial layer 120 may be less than $10^9$ defects cm$^{-2}$ in some embodiments, less than $10^6$ defects cm$^{-2}$ in some embodiments, less than $10^4$ defects cm$^{-2}$ in some embodiments, less than $10^2$ defects cm$^{-2}$ in some embodiments, and yet less than 10 defects cm$^{-2}$ in some embodiments.

The structures and methods described above for growing III-nitride materials may be used to form semi-nitrogen-polar or semi-gallium-polar GaN on sapphire substrates. The resulting structures can be mass-produced using some standard techniques such as MOCVD, etching, chemical-mechanical polishing, etc., and may be scaled to different substrate sizes. These processes can avoid expenses associated with trying to grow bulk GaN crystals and produce wafers from such boules. Conventionally, semi-nitrogen-polar GaN can only be produced by slicing expensive bulk GaN substrates, with limited availability and sizes. The structures and methods described above may enable the synthesis of semi-nitrogen-polar GaN planes on relatively inexpensive sapphire substrates, which are commercially mature and widely available.

Although the structures and methods described above primarily relate to forming semi-gallium-polar (20$\underline{2}$1) GaN and semi-nitrogen-polar (20$\underline{2}$1) GaN epitaxial layers, the methods may be used to form other semipolar facet orientations. For example, nonpolar (11$\underline{2}$0), and (10$\underline{1}$0), as well as semipolar (10$\underline{1}$1), (10$\underline{1}$1), (11$\underline{2}$2), (11$\underline{2}$2) may be grown using a patterned sapphire substrate with different crystallographic orientations. Virtually any GaN orientation in an epitaxial layer may be possible by using a correctly sliced sapphire substrate. Although epitaxial growth of semipolar GaN has been described, semipolar orientations of other III-nitride materials (e.g., (Al, In, Ga)N) may be grown according to some embodiments. The structures and methods may also be used to form various semipolar III-nitride alloys (e.g., AlGaN, InGaN, InAlGaN). In some implementations, a portion or all of an epitaxially-grown layer may be doped to have n-type or p-type conductivity, so that integrated circuit devices such as transistors, diodes, thyristors, LEDs and laser diodes can be fabricated in the epitaxial layer. Doping may be done during epitaxial growth in some cases, and/or after growth (e.g., using ion implantation into the epilayer). Microfabrication-grade substrates may be mass-produced using some standard techniques such as MOCVD, etching, chemical-mechanical polishing, etc., and the substrates may be scaled to different sizes (e.g., larger than 2-inch diameter). The processes described above can avoid expenses associated with growing bulk GaN crystals and producing wafers from such boules. The structures and methods described above may enable the fabrication of semipolar GaN epilayers on relatively inexpensive sapphire substrates, which are commercially mature and widely available.

Semi-nitrogen-polar GaN planes may provide solutions to light-emitting diode (LED) challenges such as "efficiency droop" (LED efficiency drops as the injection current increases) and "green gap" (LED efficiency drops as the emission wavelength increases from blue to green to yellow). Nonpolar or semipolar GaN may be a useful candidate for the reduction of efficiency droop and improving efficiency of long-wavelength light-emitting diodes. The ability to design devices with wide quantum wells (QWs), without suffering from efficiency degradation due to the quantum-confined Stark effect, may enable high efficiencies at high carrier densities due to an increased active volume. For example, the semipolar (20$\underline{2}$1) orientation has recently appeared to be a leading candidate for high efficiency and long wavelength LEDs and laser diodes (LDs), ever since the initial demonstration of a green LD in 2009. Further investigations in semipolar orientations have yielded results showing the (20$\underline{2}$1) orientation to have beneficial properties over the (20$\underline{2}$1) orientation for carrier transport and efficiency droop. As can be shown by calculations, the polarization field for the (20$\underline{2}$1) orientation points in a direction opposite to its (20$\underline{2}$1) counterpart. With the much reduced polarization field (approximately 25% of Ga-polar GaN), this direction of polarization field is of the same order of magnitude and opposite to the built-in junction field, allowing the band profile in QWs fabricated in (20$\underline{2}$1) GaN to be closer to flat-band condition. This can increase the electron overlap, improve the radiative efficiency, and improve the droop characteristics. In addition, the (20$\underline{2}$1) orientation displays increased InGaN homogeneity, enhanced indium incorporation at higher temperatures yielding higher active layer quality, improved transport properties enabling enhanced uniformity of carrier concentration between QWs, and reduced thermal droop. Such characteristics make semi-nitrogen-polar GaN highly desirable for integrated device fabrication.

EXAMPLES

Figure 3A:
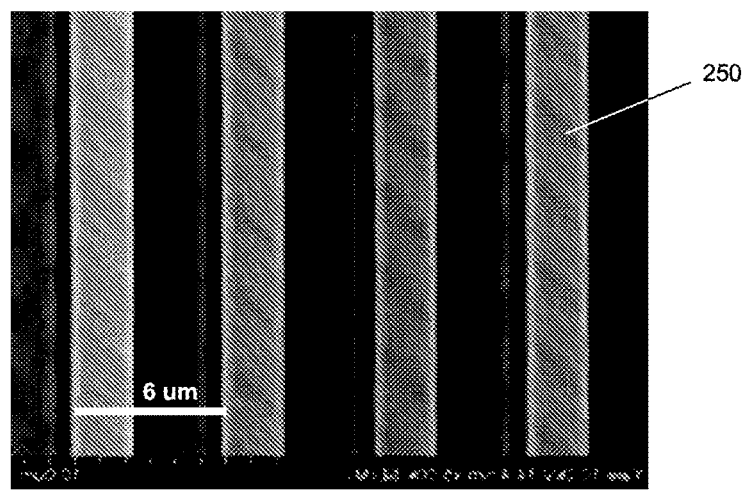
FIGS. 3A is a scanning-electron micrograph showing, in plan view, semi-gallium-polar GaN stripes formed on a patterned sapphire substrate, according to some embodiments.

Epitaxial growth of semi-gallium-polar and semi-nitrogen-polar GaN was carried out on patterned sapphire substrates following the methods described above. FIG. 3A is a scanning electron micrograph that shows, in plan view, semi-gallium-polar GaN crystals 250 grown from a masked and patterned sapphire substrate 105, according to some embodiments. The PSS comprises crystal-growth surfaces 115 spaced approximately 6 μm apart, and the etch depth D of trenches in the sapphire substrate is approximately 1 μm. The crystal-growth surfaces are oriented at approximately 75° from the process surface of the substrate. Other surfaces on the PSS substrate were masked with a PECVD oxide, as described above in connection with FIGS. 2C-2F. A LT GaN buffer layer approximately 20 nm thick was formed, without nitridation, on the crystal growth surfaces 115 of the substrate. The growth conditions for the buffer layer were: pressure of approximately 200 mbar, temperature of approximately 500° C., an $NH_3$ flow of approximately 1 slm, and a TMGa flow rate of approximately 40 sccm. Subsequently, semi-gallium-polar GaN was grown under the following epitaxial growth conditions: approximately 1030° C., approximately 100 mbar, approximately 40 sccm TMGa, and approximately 1 slm $NH_3$.

The micrograph of FIG. 3A shows bars of GaN crystal 250 that are grown from the crystal-growth surfaces 115 with high uniformity. When an evaporation process is used to form the masking oxide instead of PECVD, the inventors observe nucleation and crystal growth over other surfaces of the patterned sapphire substrate in addition to the crystal growth surfaces. This leads to highly non-uniform III-nitride material that is unsuitable for integrated circuit fabrication.

Figure 3B:
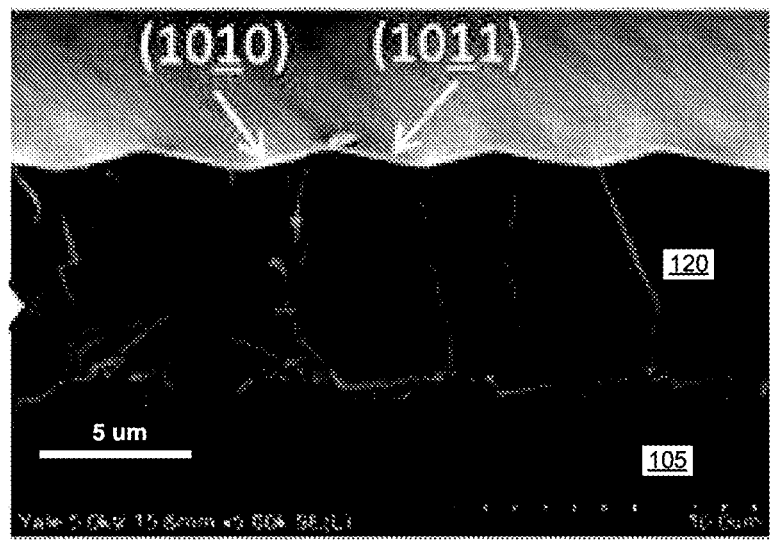
FIG. 3B is a scanning-electron micrograph showing, in elevation view, coalesced semi-gallium-polar GaN formed on a patterned sapphire substrate, according to some embodiments.

The growth of the GaN was continued for about two hours, so that the crystals 250 coalesced into a continuous layer of GaN semiconductor 120, as depicted in FIG. 3B. The coalesced crystal exhibits ridges and sub-facets, and comprises two slow-growing crystal facets (10$\bar{1}$0) and (10$\bar{1}$1) at a process surface of the substrate. Symmetric x-ray rocking curves showing a linewidth of approximately 360 arcseconds were measured from the coalesced GaN, and indicate a dislocation density of approximately $10^9$ cm$^{-2}$ range.

Figure 3C:
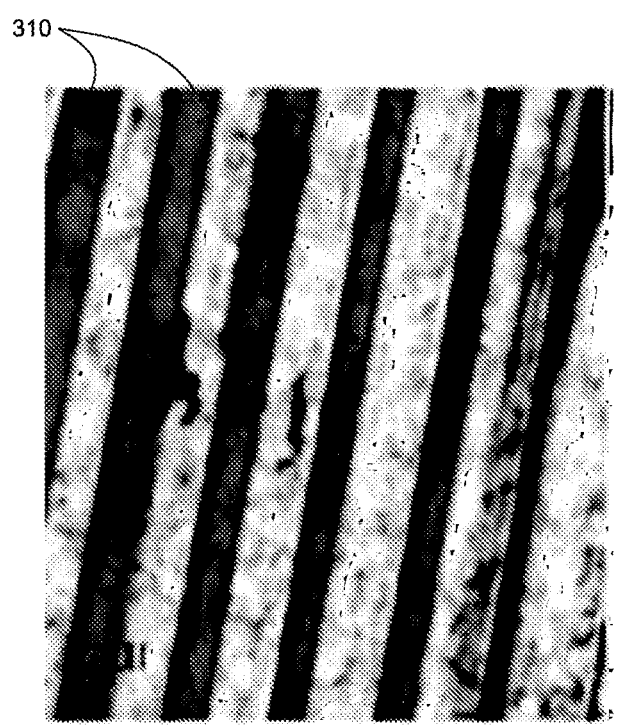
FIG. 3C shows cathodoluminescence measured from semi-gallium-polar GaN stripes formed on a patterned sapphire substrate, according to some embodiments.

Transmission-electron microscope (TEM) measurement, cathodoluminescence (CL) measurements, and CL spectral map characterizations were also made for the coalesced GaN. CL measurements for the coalesced semi-gallium-polar GaN are shown in FIG. 3C. Cross-sectional TEM images indicate that the region underneath the (10$\bar{1}$0) m-plane has a high density of basal-plane stacking faults (BSFs) due to Ga-polar GaN growth. The TEM images also indicate that the region underneath the (10$\bar{1}$1) facet has many dislocations. The BSFs are likely responsible for the dark bands 310 visible in the CL panchromatic map reproduced in FIG. 3C. Higher magnification CL measurements suggest that the (10$\bar{1}$1) regions have dislocations between approximately $10^8$ cm$^{-2}$ and approximately $10^9$ cm$^{-2}$, which appear to be initiated at the coalescence region of the stripes.

In a second set of GaN growth runs, nitridation of the crystal-growth surfaces, as described in connection with FIG. 2G, was carried out before forming a LT GaN buffer layer over these surfaces. The nitridation provides the polarity flip, so that semi-nitrogen-polar GaN may be grown. The buffer layer was formed under the same epitaxial growth conditions as for the semi-gallium-polar growth described above. However, the buffer layer thickness was increased to about 80 nm, and the buffer layer annealing conditions were: 1030° C. for between 2 and 4 minutes. Subsequently, semi-nitrogen-polar GaN was grown at high temperature from the crystal-growth surfaces 115 using the same epitaxial growth conditions described in the above example for semi-gallium-polar GaN.

Figure 4A:
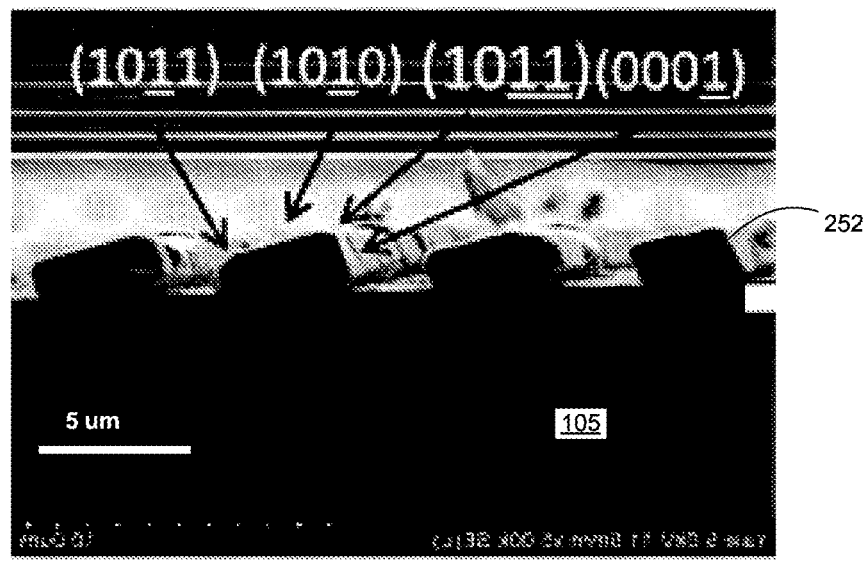
FIG. 4A is a scanning-electron micrograph showing, in elevation view, semi-nitrogen-polar GaN stripes formed on a patterned sapphire substrate, according to some embodiments.
Figure 4B:
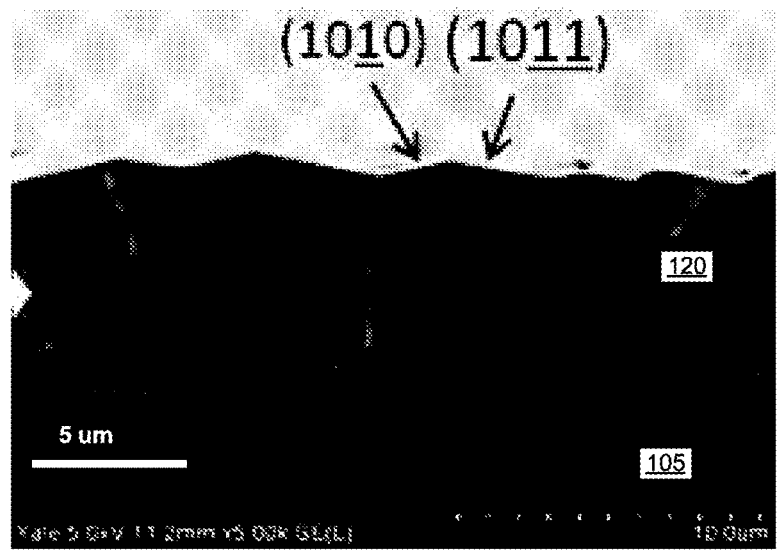
FIG. 4B is a scanning-electron micrograph showing, in elevation view, coalesced semi-nitrogen-polar GaN formed on a patterned sapphire substrate, according to some embodiments.

FIG. 4A is a scanning electron micrograph showing, in elevation view, semi-nitrogen-polar GaN crystals 252 forming from the crystal-growth surfaces of a patterned sapphire substrate 105. Several facets of the GaN crystal are indicated in the micrograph. The crystal growth was continued to coalescence as shown in FIG. 4B. The coalesced structure shows a continuous layer of semi-nitrogen-polar GaN 120 extending over the patterned sapphire substrate 105. The semiconductor layer includes ridges and sub-facets (10$\bar{1}$0) and (10$\bar{1}$1), which is a structure similar to the ridged surface of the semi-gallium-polar GaN shown in FIG. 3B.

Figure 4C:
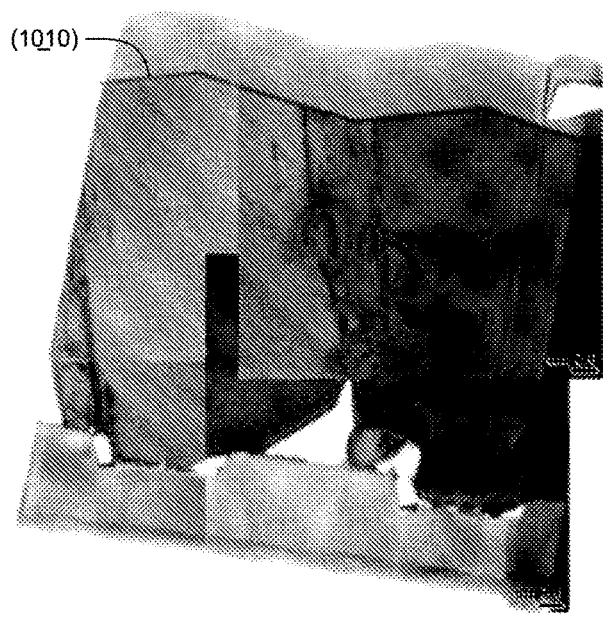
FIG. 4C is a transmission-electron micrograph of a region of semi-nitrogen-polar GaN formed on a patterned sapphire substrate.

FIG. 4C is a transmission-electron microscope (TEM) image showing contrast associated with defects along the basal plane direction at the c-plane growth surface. The extension of these defects is limited to this area, and the majority of the material in the growth direction shows minimal defect contrast. The region underneath the (10$\bar{1}$0) m-plane has a much lower density of basal-plane stacking faults (BSFs) and the region underneath the (10$\bar{1}$1) facet also appears to have a lower defect density as compared to similar images for semi-gallium-polar GaN formed under the same growth conditions. However, close to the coalescence boundary, additional defects are generated. Under conventional epitaxial growth methods employed on planar sapphire substrates, material generated in the N-polar growth direction typically exhibits stacking faults. This fault generation has been attributed to the interaction of the growth mask or template with the N-polar growth direction. For the results shown here, a majority of the GaN grown would be in the N-polar growth direction. However, as indicated by TEM imaging and microstructural characterization of semi-nitrogen-polar GaN layers formed on patterned sapphire substrates, N-polar directional growth (in a direction approximately normal to the crystal-growth surfaces) is not intrinsically poor, and the material quality can be comparable to Ga-polar GaN layers grown on sapphire. For the PSS, since growth crystals are directed upwards and away from the substrate, a reduced interaction of the sapphire template may reduce or eliminate a tendency for stacking faults to occur. Other than a few stacking faults that propagate up from the growth interface, and dislocations near the coalescence of the crystals, the epitaxially-grown semi-nitrogen-polar GaN shown in the TEM image of FIG. 4C is largely free of defect contrast.

Figure 4D:
FIG. 4D shows cathodoluminescence measured from coalesced semi-nitrogen-polar GaN formed on a patterned sapphire substrate, according to some embodiments.

Cathodoluminescence of the coalesced semi-nitrogen-polar GaN layer 120 is shown in FIG. 4D. The CL image indicates that a majority of the faulting is shown to be below the (10$\bar{1}$0) type facets, as shown by the dark areas in the CL images. The CL results are consistent with observations from the TEM image. The CL image does not have dark bands that are present in the semi-gallium-polar GaN (see FIG. 3C). The absence of these dark bands indicates that the basal stacking faults are greatly reduced for the semi-nitrogen-polar GaN. Accordingly, semi-nitrogen-polar GaN (20$\bar{2}$1) epilayers may have a better microstructural quality than semi-gallium-polar GaN (20$\bar{2}$1) epilayers formed according to the above-described processes.

Figure 4E:
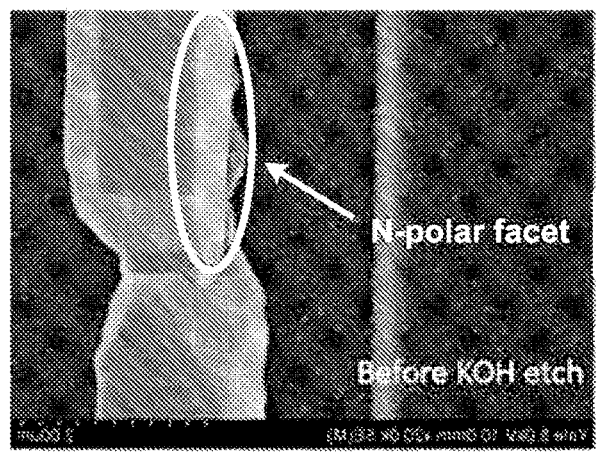
FIG. 4E is a scanning-electron micrograph showing, in plan view, a portion of a semi-nitrogen-polar GaN stripe formed on a patterned sapphire substrate.
Figure 4F:
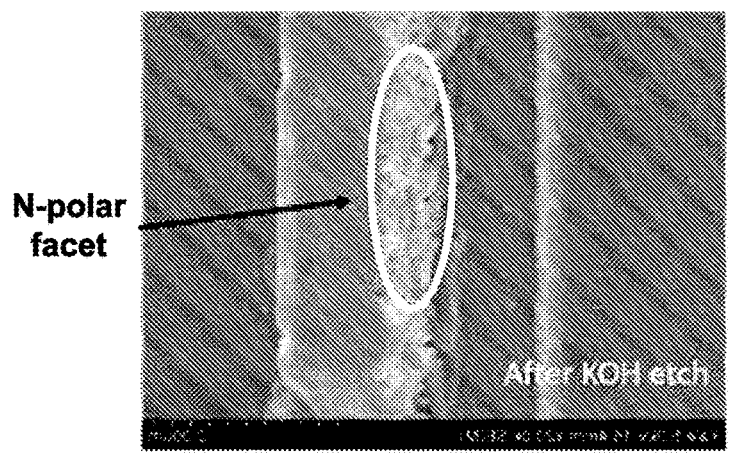
FIG. 4F is a scanning-electron micrograph showing, in plan view, a portion of a semi-nitrogen-polar GaN stripe formed on a patterned sapphire substrate that has been subjected to a potassium hydroxide etch to verify nitrogen polarity of the GaN facet.

An etching test was carried out to determine that the epitaxially-grown GaN has a semi-nitrogen-polar orientation. For this test, non-coalesced GaN crystals were etched in 5M KOH etch solution at room temperature for 5 min. FIG. 4E is an SEM image showing a posited nitrogen-polar facet of an epitaxially-grown crystal before the etch. FIG. 4F shows a similar facet after the etch. It is seen by SEM that the facet facing outward is etched and roughened. The roughened surface confirms that an N-polar GaN (000$\bar{1}$) facet is grown from crystal-growth surface of the patterned sapphire substrate.

Figure 5:
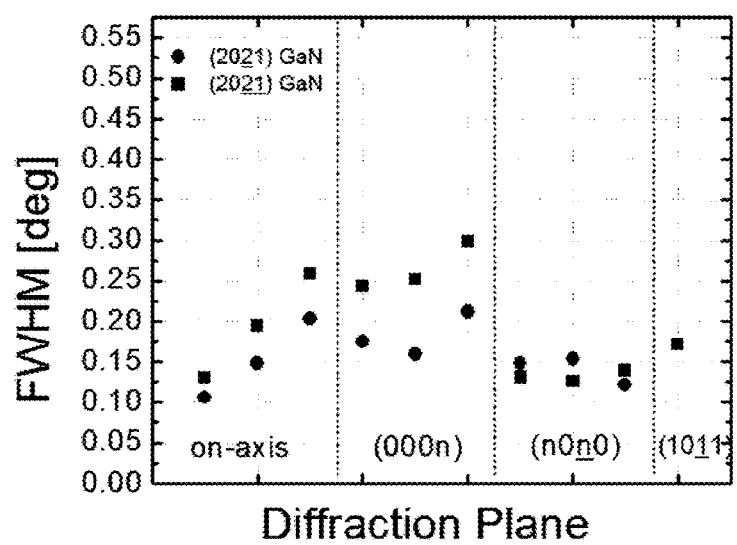
FIG. 5 is a plot of high-resolution x-ray rocking curve measurements taken over a wide range of on-axis and off-axis diffractions for semi-nitrogen-polar GaN (squares) and semi-gallium-polar GaN (circles) formed on a patterned sapphire substrate.

FIG. 5 plots results from high-resolution x-ray diffraction rocking curve analyses for the semi-gallium-polar and semi-nitrogen-polar GaN epitaxial layers. The measurements are performed in open detector configuration and over a wide range of on-axis and off-axis diffractions. For both semi-nitrogen-polar (20$\bar{2}$1) and semi-gallium-polar (20$\bar{2}$1) orientations, the rocking curve linewidths can reach below 360 arcsecs, indicating good microstructural semiconductor quality.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

Selective etching, as used herein, comprises subjecting a substrate to an etchant that preferentially etches at least one material at a faster rate than a second material. In some cases, the second material may be formed as a hard mask (e.g., an inorganic material such as an oxide, nitride, metal, or the like) or soft mask (e.g., a photoresist or polymer). In some embodiments, the second material may be part of a device structure that has different material characteristics than the first material (e.g., doping density, material composition, or crystal structure). The etch may be a dry etch or wet etch.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings typically depict a small portion of an epitaxially-grown GaN layers, it will be appreciated that a large area or entire substrate may be covered with such an epitaxially-grown layer. Further, the epitaxial layer may be planarized (e.g., by chemical-mechanical polishing) and integrated-circuit devices (e.g., transistors, diodes, thyristors, light-emitting diodes, laser diodes, photodiodes and the like) may be fabricated using the epitaxially-grown material. In some embodiments, the integrated-circuit devices may be used in consumer electronic devices such as smart phones, tablets, PDA's, computers, televisions, sensors, lighting, displays, as well as application-specific integrated circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for forming an epitaxial layer of semipolar gallium-nitride on a substrate, the method comprising:
   forming a conformal masking layer over a patterned surface of a patterned sapphire substrate;
   depositing a resist over a portion of the masking layer by performing a shadow evaporation to deposit an evaporant;
   etching regions of the masking layer that are not covered by the resist to expose crystal-growth surfaces on the patterned sapphire substrate; and
   growing semipolar gallium-nitride from the crystal-growth surfaces.

2. The method of claim 1, wherein forming the conformal masking layer comprises depositing a material by a vapor deposition process.

3. The method of claim 2, wherein the vapor deposition process comprises plasma enhanced chemical vapor deposition or atomic layer deposition.

4. The method of claims 2, wherein the vapor deposition process comprises depositing an oxide or a nitride.

5. The method of claim 1, wherein a thickness of the conformal masking layer is between approximately 10 nm and approximately 50 nm.

6. The method of claim 1, wherein the evaporant comprises a metal.

7. The method of claim 1, wherein the evaporant comprises chromium.

8. The method of claim 1, wherein the resist does not form over surfaces of the patterned sapphire substrate that are parallel to a c-plane facet of the sapphire.

9. The method of claim 1, wherein etching regions of the masking layer comprises performing a wet etch.

10. The method of claim 1, wherein growing semipolar gallium-nitride comprises epitaxially growing semi-gallium-polar GaN from the crystal-growth surfaces.

11. The method of claim 10, further comprising growing a gallium-nitride buffer layer at a temperature below approximately 600° C. prior to growing the semi-gallium-polar GaN.

12. The method of claim 10, wherein the semi-gallium-polar GaN has a (20 $\bar{2}$1) facet parallel to a process surface of the substrate.

13. The method of claim 1, further comprising:
   nitridizing the crystal-growth surfaces; and
   growing a gallium-nitride buffer layer at a temperature below approximately 600° C. prior to growing the semi-nitrogen-polar GaN.

14. The method of claim 13, wherein growing semipolar gallium-nitride comprises epitaxially growing semi-nitrogen-polar GaN from the crystal-growth surfaces.

15. The method of claim 13, wherein nitridizing the crystal-growth surfaces comprises heating the patterned sapphire substrate to a temperature between approximately 900° C. and approximately 1000° C. in an ambient comprising a mixture of nitrogen ($N_2$) and ammonia ($NH_3$) gases.

16. The method of claim 13, wherein growing a gallium-nitride buffer layer comprises growing the gallium-nitride buffer layer to a thickness greater than approximately 50 nm.

17. A method for forming an epitaxial layer of semipolar gallium-nitride on a substrate, the method comprising:
forming a conformal masking layer over a patterned surface of a patterned sapphire substrate;
depositing a resist over a portion of the masking layer;
etching regions of the masking layer that are not covered by the resist to expose crystal-growth surfaces on the patterned sapphire substrate;
epitaxially growing semi-nitrogen-polar gallium-nitride from the crystal-growth surfaces;
nitridizing the crystal-growth surfaces;
growing a gallium-nitride buffer layer at a temperature below approximately 600° C. prior to growing the semi-nitrogen-polar GaN, wherein growing a gallium-nitride buffer layer comprises:
heating the substrate to between approximately 450° C. and approximately 600° C.;
pressurizing a growth chamber to between approximately 100 mbar and approximately 250 mbar;
flowing $NH_3$ into the growth chamber at a rate between approximately 1 slm and approximately 4 slm;
flowing trimethylgallium (TMGa) into the growth chamber at a rate between approximately 30 sccm and approximately 50 sccm; and
growing the gallium-nitride buffer layer to a thickness between approximately 20 nm and approximately 100 nm.

18. The method of claim 14, wherein the semi-nitrogen-polar GaN has a (20$\underline{2}$1) facet parallel to a process surface of the substrate.

19. A substrate comprising:
a patterned sapphire substrate having a plurality of surfaces at different orientations and a masking layer formed over some of the surfaces;
crystal-growth surfaces that are a portion of the plurality of surfaces and that are not covered by the masking layer; and
epitaxial gallium-nitride formed adjacent the crystal-growth surfaces, wherein the patterned sapphire substrate has a (224$\underline{3}$) facet approximately parallel to a process surface of the substrate and a c-plane facet approximately parallel to the crystal-growth surfaces.

20. The substrate of claim 19, wherein the patterned sapphire substrate comprises an array of trenches with the crystal-growth surfaces forming walls of the trenches.

21. The substrate of claim 20, wherein a spacing of the trenches is between approximately 0.25 microns and approximately 10 microns, and a depth of the trenches is between approximately 50 nanometers and approximately 2 microns.

22. The substrate of claim 20, wherein the epitaxial gallium-nitride coalesces above the trenches to form a continuous semiconductor layer across the substrate.

23. The substrate of claim 19, further comprising a buffer layer between the crystal-growth surfaces and the epitaxial gallium-nitride.

24. The substrate of claim 19, wherein the crystal-growth surfaces are nitridized.

25. The substrate of claim 19, wherein the epitaxial gallium-nitride has a (20$\underline{2}$1) or (20$\underline{2}$1) facet parallel to an initial unetched surface of the sapphire substrate.

26. The substrate of claim 19, wherein the crystal-growth surfaces are nitridized and include a gallium-nitride buffer layer.

27. The substrate of claim 26, wherein the epitaxial gallium-nitride has a semi-nitrogen-polar facet parallel to a process surface of the substrate.

28. The method of claim 17, wherein the semi-nitrogen-polar GaN has a (20$\underline{2}$1) facet parallel to a process surface of the substrate.

29. The method of claim 17, wherein depositing the resist comprises performing a shadow evaporation to deposit an evaporant.

* * * * *

UNITED STATES PATENT AND TRADEMARK OFFICE
CERTIFICATE OF CORRECTION

PATENT NO.        : 9,978,589 B2
APPLICATION NO.   : 15/304135
DATED             : May 22, 2018
INVENTOR(S)       : Jung Han et al.

Page 1 of 1

It is certified that error appears in the above-identified patent and that said Letters Patent is hereby corrected as shown below:

In the Claims

In Claim 12, at Column 16, Line 52, delete "polar GaN has a (20 21) facet" and insert --polar GaN has a (2021) facet--

Signed and Sealed this
Fourteenth Day of August, 2018

Andrei Iancu
*Director of the United States Patent and Trademark Office*